(12) United States Patent
Chen et al.

(10) Patent No.: US 8,310,283 B2
(45) Date of Patent: Nov. 13, 2012

(54) OVER-DRIVE CIRCUIT HAVING STACKED TRANSISTORS

(75) Inventors: Chia-Hui Chen, Hsinchu (TW); Guang-Cheng Wang, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 21 days.

(21) Appl. No.: 12/905,294

(22) Filed: Oct. 15, 2010

(65) Prior Publication Data

US 2011/0102070 A1 May 5, 2011

Related U.S. Application Data

(60) Provisional application No. 61/256,157, filed on Oct. 29, 2009.

(51) Int. Cl.
*H03K 17/08* (2006.01)
*H03K 19/094* (2006.01)
*H03K 19/0185* (2006.01)

(52) U.S. Cl. ............................ 327/112; 327/384; 326/83

(58) Field of Classification Search ........................ None
See application file for complete search history.

(56) References Cited

U.S. PATENT DOCUMENTS

| | | | | |
|---|---|---|---|---|
| 5,736,869 A * | 4/1998 | Wei | .................................. | 326/81 |
| 6,466,078 B1 * | 10/2002 | Stiff | .............................. | 327/536 |
| 7,190,191 B1 * | 3/2007 | Mathur et al. | .................. | 326/68 |
| 7,463,073 B2 * | 12/2008 | Chung et al. | .................. | 327/112 |
| 7,741,874 B2 * | 6/2010 | Nedalgi | ............................. | 326/83 |
| 7,936,209 B2 * | 5/2011 | Bhattacharya et al. | ........ | 327/543 |
| 2006/0152255 A1 * | 7/2006 | Wang et al. | .................... | 327/112 |
| 2010/0121277 A1 * | 5/2010 | Fehr et al. | ..................... | 604/151 |
| 2010/0283439 A1 * | 11/2010 | Singh et al. | .................... | 323/282 |

* cited by examiner

*Primary Examiner* — Lincoln Donovan
*Assistant Examiner* — Terry L Englund
(74) *Attorney, Agent, or Firm* — Lowe Hauptman Ham & Berner, LLP

(57) ABSTRACT

In a first pair of stacked PMOS devices comprising a first PMOS device and a second PMOS device, a first pumping circuit is coupled between a gate of the first PMOS device and a P pre-driver signal. In a second pair of stacked NMOS devices comprising a first NMOS device and a second NMOS device, a second pumping circuit is coupled between a gate of the first NMOS device and an N pre-driver signal. The pumping circuits recognizing the transition from the pre-driver signals provide a voltage to the gate of the first PMOS device and of the first NMOS device so that the first PMOS and NMOS devices are turned on better. As a result, their voltage Vds peaks are suppressed to a safe level; the devices avoid hot-carrier degradations; and their lifetimes are prolonged.

20 Claims, 6 Drawing Sheets

OVER-DRIVE CIRCUIT HAVING STACKED TRANSISTORS

CROSS-REFERENCE TO RELATED APPLICATIONS

The present application claims priority of U.S. Provisional Patent Application Ser. No. 61/256,157, filed on Oct. 29, 2009, which is incorporated herein by reference in its entirety.

TECHNICAL FIELD

The present disclosure is generally related to a voltage pumping circuit. In various embodiments, the pumping circuit improves hot-carrier reliability effects.

BACKGROUND

Hot-carriers refer to holes or electrons that have gained very high kinetic energy in areas of high electrical field intensity within a semiconductor device (e.g., a metal-oxide semiconductor (MOS) device). Because of their high kinetic energy, hot carriers can get trapped in device areas (e.g., the gate oxide, the silicon-oxide interface, etc.) where they should not be, which can cause changes to the device threshold voltage and diminish device lifetime. Stacked MOS devices have been widely used in over-drive circuits to reduce hot-carrier degradation and reliability effects. In many approaches, however, voltage Vds, the voltage drop across the drain and the source of a MOS (e.g., the first MOS in a pair of stacked MOS devices) still experiences a high over-voltage during a gate signal transition (e.g., a transition from a low voltage level to a high voltage level or from a high voltage level to a low voltage level), which continues to cause hot-carrier degradations.

BRIEF DESCRIPTION OF THE DRAWINGS

The details of one or more embodiments of the invention are set forth in the accompanying drawings and the description below. Other features and advantages of embodiments of the invention will be apparent from the description, drawings, and claims.

Like reference symbols in the various drawings indicate like elements.

DETAILED DESCRIPTION

Figure 1:
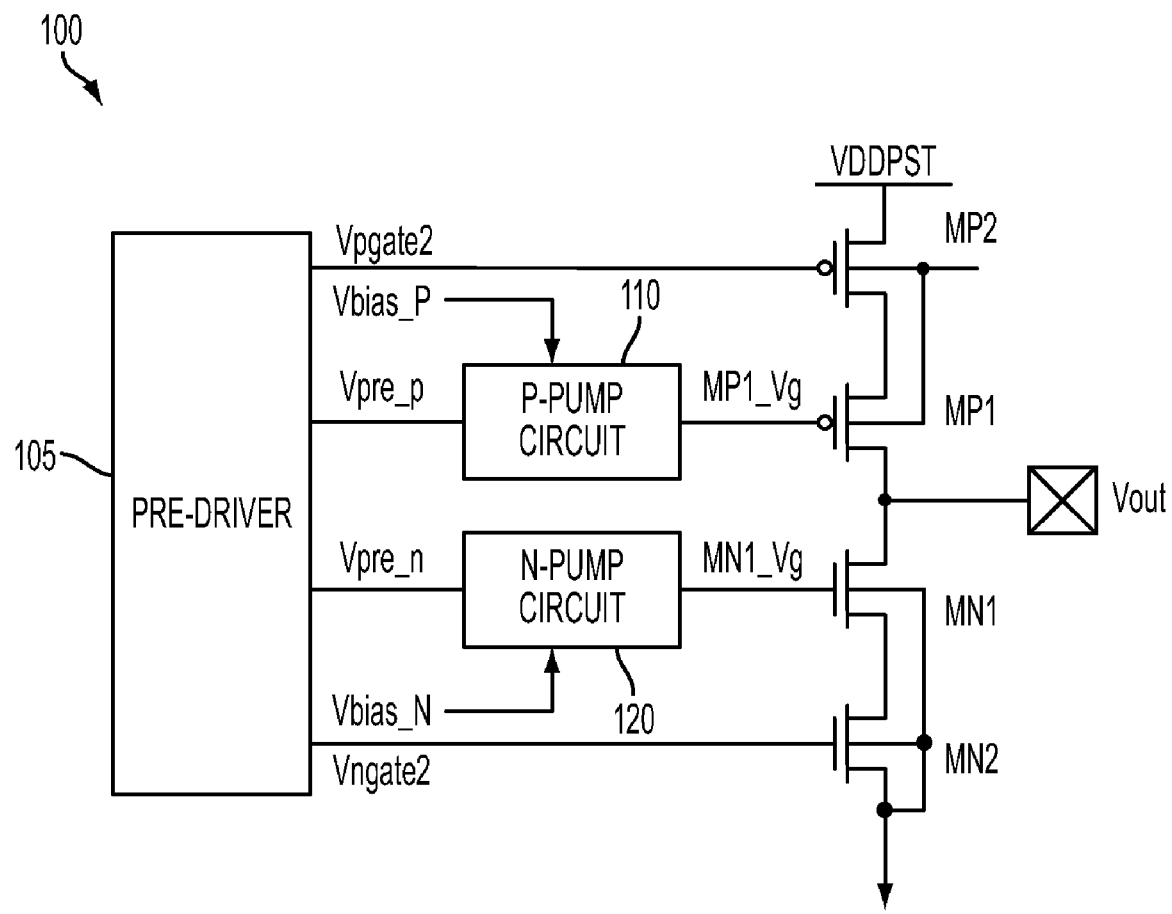
FIG. 1 shows a circuit in accordance with an embodiment.

Embodiments, or examples, of the invention illustrated in the drawings are described below using specific language. It will nevertheless be understood that no limitation of the scope of the invention is thereby intended. Any alterations and modifications in the described embodiments, and any further applications of principles of the invention described in this document are contemplated as would normally occur to one of ordinary skill in the art to which the invention relates. Reference numbers may be repeated throughout the embodiments, but this does not necessarily require that feature(s) of one embodiment apply to another embodiment, even if they share the same reference number.

Examplary Over-Drive Circuit

FIG. 1 shows a circuit 100 in accordance with an embodiment. Circuit 100 is an output circuit that can be over-driven to a voltage higher than the process defined device operation voltage.

Pre-driver 105 includes logic circuitry to control circuit 100 to a specific logic state, e.g., high, low, tri-state, etc. Pre-driver 105 provides voltage Vpre_p to and thus controls P-pump circuit 110. Voltage Vpre_p provides a transitioning voltage based on which a "pump" voltage is provided to node MP1_Vg. Pre-driver 105 also provides voltage Vpgate2 and voltage Vngate2 that drive transistor MP2 and MN2, respectively.

Voltage Vbias_P is transferred to node MP1_Vg and works in conjunction with P-pump circuit 110 to suppress unwanted over-voltage of voltage MP1_Vsd (the voltage drop between the source and the drain of transistor MP1, not shown). Voltage Vbias_P may be referred to as the middle bias because, in various embodiments, voltage Vbias_P is between 0V and voltage VDDPST, the supply voltage for transistors MP1, MP2, MN1, and MN2. In an embodiment of 1.8V device (e.g., the operation voltage defined by a manufacturing process), voltage Vbias_P is configured to be 1.8V to eliminate/reduce the gate-oxide breakdown or hot-carrier effect causing device un-reliabilities. Depending on applications, voltage Vbias_P may be part of P-pump circuit 110.

P-pump circuit 110, coupled between pre-driver 105 and the gate of transistors MP1, and in conjunction with voltage Vbias_P, provides the pump voltage to the gate of transistor MP1 (e.g., node MP1_Vg) upon detecting a transition of voltage Vpre_p, e.g., from a high to a low. As a result, transistor MP1 turns on better and causes voltage MP1_Vsd to be suppressed to a safe voltage level. Because voltage MP1_Vsd operates at a safe level, hot-carrier degradations can be avoided, and the device lifetime can be prolonged. Depending on application, the lifetime of the device using various embodiments of the invention can be greater than about 10 years.

Comparable to P-pump circuit 110, N-pump circuit 120 coupled between pre-driver 105 and the gate of transistors MN1, and in conjunction with voltage Vbias_N, provides the pump voltage to the gate of transistor MN1 (e.g., node MN1_Vg) upon detecting a transition of voltage Vpre_n, e.g., from a low to a high. As a result, transistor MN1 turns on better and causes voltage MN1_Vds to be suppressed to a safe voltage level. Because voltage MP1_Vds operates at a safe level, hot-carrier degradations can be avoided, and the device lifetime can be prolonged. Depending on application, the lifetime of the device using various embodiments of the invention can be greater than about 10 years.

The pair of PMOS transistors MP1 and MP2 and the pair of NMOS transistors MN1 and MN2 may be referred to as stacked MOS transistors, post drivers (e.g., P-post drivers and N-post drivers, respectively), an over-drive output buffer, etc. As illustratively shown in FIG. 1, transistors MP2. MP1, MN1 and MN2 are coupled in series wherein the source of transistor MP2 is coupled to supply voltage source VDDPST, the drain of transistor MP2 is coupled to the source of transistor MP1, the drain of transistor MP1 is coupled to the drain of transistor MN1, which also serves as an output for circuit 100 having voltage Vout. Further, the source of transistor MN1 is coupled to the drain of transistor MN2, and the source of transistor MN2 is coupled to ground, which, as recognizable by persons of ordinary skill in the art, is also voltage VSS (e.g., a reference voltage source). The output swing of these P-type and N-type over-drive output buffers can be larger than their process defined operation voltage. For example, in an embodiment, transistors MP1, MP2, MN1, and MN2 are 1.8V devices but their output swing can be 0-3.3V (e.g., VDDPST can be at 3.3V). Further, in some embodiments, a dynamic floating N-well is used with PMOS transistors MP1 and MP2 to bias the body of these transistors to the highest voltage level and avoid possible leakage caused by the parasitic diode being turned on.

Voltage Vout serves as the output voltage for circuit 100. Depending on applications, various embodiments of the invention are advantageous when Vout is transitioning, e.g., from a low to a high, or from a high to a low. For example, each of the P-pump circuit 110 and N-pump circuit 120 provides a pump voltage at a particular transition. Further, in the embodiment of FIG. 1, P-pump circuit 110 provides a pump voltage (e.g. a "P-pump" voltage) and therefore is advantageous when voltage Vout is transitioning from a low to a high. In contrast, N-pump circuit 120 provides another pump voltage (e.g., an "N-pump voltage) and therefore is advantageous when voltage Vout is transitioning from a high to a low.

Figure 2:
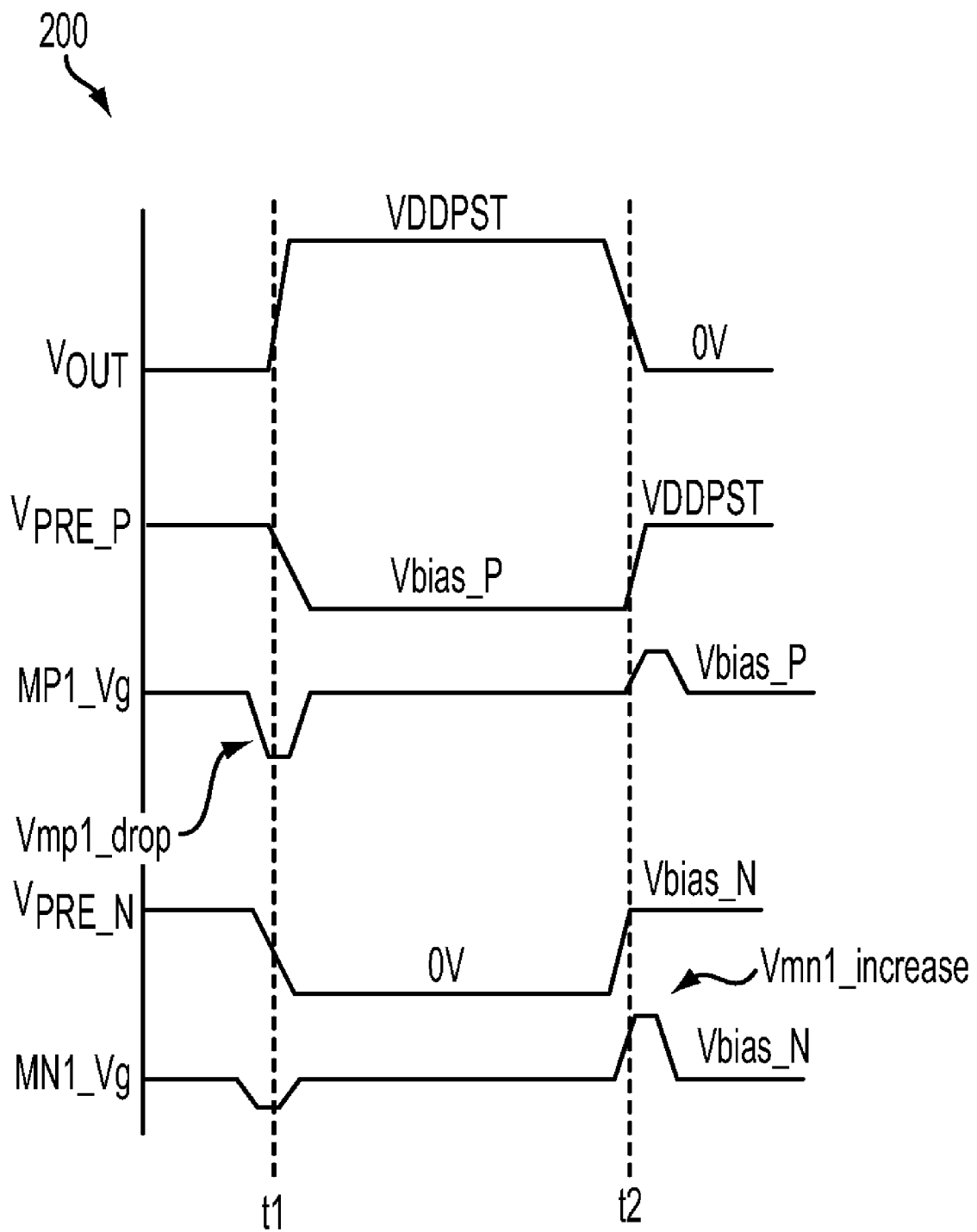
FIG. 2 shows waveforms illustrating operation of the circuit in FIG. 1, in accordance with an embodiment.

FIG. 2 shows waveforms 200 illustrating operations of circuit 100, in accordance with an embodiment. Voltage Vout transitions between 0V and voltage VDDPST. Voltage Vpre_p transitions between two different levels (e.g., a high and a low), and in this embodiment, between voltage VDDPST and voltage Vbias_p. Voltage MP1_Vg is generally configured at voltage Vbias_p.

At about time t1, voltage Vout or the drain of transistor MP1 (e.g., node MP1_Vd not labeled) is transitioning from 0V to voltage VDDPST, and voltage Vpre_p is transitioning from voltage VDDPST toward voltage Vbias_P. In accordance with some embodiments, P-pump circuit 110 in conjunction with voltage Vbias_P causes a drop in voltage MP1_Vg shown as voltage Vmpl_drop that prevents or reduces an over-voltage of voltage MP1_Vsd, which, in turns, eliminates/reduces the hot-carrier effect in transistor MP1.

Similarly, at about time t2, voltage Vout or the drain of transistor MN1 (e.g., node MN1_Vd, not labeled) is transitioning from voltage VDDPST to 0V and voltage Vpre_n is transitioning from 0V toward Vbias_N. In accordance with some embodiments, N-pump circuit 120 in conjunction with voltage Vbias_N causes an increase in voltage MN1_Vg shown as voltage Vmnl_increase that prevents or reduces an over-voltage of voltage MN1_Vds, which, in turns, eliminates/reduces the hot-carrier effect in transistor MN1.

Voltage Pumping Circuits

Figure 3:
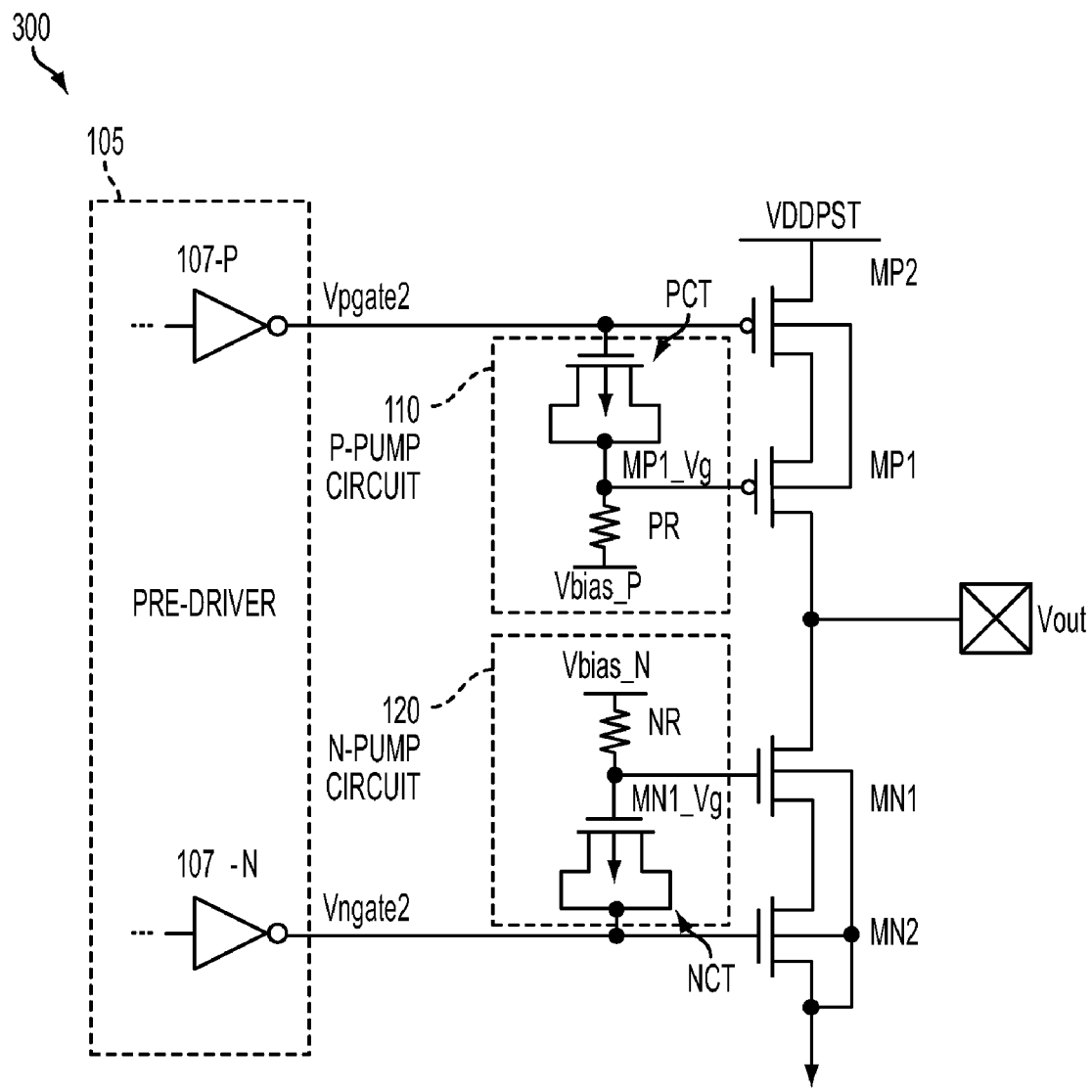
FIG. 3 shows a schematic drawing of an exemplary circuit, in accordance with an embodiment.

FIG. 3 shows a schematic drawing of an exemplary circuit 300 and depicts details of an exemplary P-pump circuit 110 and an exemplary N-pump circuit 120 in accordance with an embodiment. Further, as compared to FIG. 1, pre-driver 105 in FIG. 3 is shown as having the last stage with inverters 107-P and 107-N, which, as those of ordinary skill in the art will recognize, are commonly used in the pre-driver circuits. Additionally, voltage Vpgate2 and voltage Vpre_p in circuit 100 are the same while voltage Vngate2 and voltage Vpre_n in circuit 100 are the same.

P-pump circuit 110, coupled between the gates of transistors MP1 and MP2, provides a pump voltage to node MP1_Vg upon detecting a transition of voltage Vpgate2 (e.g., from a high to a low). As a result, transistor MP1 turns on better and causes voltage MP1_Vsd to be suppressed to a safe voltage level. In an embodiment, the safe level for voltage MP1_Vsd defined by a manufacturing process is less than 2.5V.

P-pump circuit 110 includes resistor PR coupled between nodes Vbias_P and MP1_Vg, and MOS transistor PCT coupled between nodes Vpgate2 and MP1_Vg. MOS transistor PCT serves as a capacitor because its source and drain are coupled together. MOS transistor PCT may be referred to as a MOS capacitor, a capacitor transistor, etc. Resistor PR and MOS capacitor PCT are shown for illustration, but various embodiments of the invention are not so limited. Other circuitry, devices, networks (e.g., a combination of circuitry and/or devices) providing resistance and capacitance in place of resistor PR and transistor PCT are within the scope of various embodiments of the invention. Examples of such circuitry include poly resistors, OD resistors (e.g., resistors in the diffusion region), well resistors, etc., metal-oxide-metal (MOM) capacitors, metal-insulator-metal (MIM) capacitors, MOS varactor capacitors, etc.

Voltage Vbias_P, coupled to one end of resistor PR, provides bias voltage Vbias_p to node MPl_Vg. Under some circumstances, voltage Vbias_P is transferred to node MP1_Vg and works in conjunction with MOS capacitor PCT to suppress unwanted over-voltage of voltage MP1_Vsd. For example, voltage Vbias_P provides via resistor PR the bias voltage for transistor MP1 to reduce voltage MP1_Vgs and thus reduce/eliminate un-reliabilities from hot-carrier effects. In the over-drive circuit of FIG. 3, voltage Vbias_P is configured to be about 10% over the middle point of 1.8V or 1.98V, which is calculated as the worst case for MP1 reliability concern. In another embodiment of 1.8V device, voltage Vbias_P is configured to be at 1.8V. If voltage Vbias_P is set lower (e.g., 0V), voltage MP1_Vsg would be 3.3V, which can cause gate-oxide breakdown.

MOS capacitor PCT, coupled between the gates of transistors MP1 and MP2 (e.g., nodes MP1_Vg and Vpgate2) provides a desired voltage to node MP1_Vg as MOS capacitor PCT is configured to retain a voltage difference between gates of transistors MP1 and MP2 previously seen by MOS capacitor PCT. In effect, various embodiments of the invention use MOS capacitor PCT to pump a desired voltage to node MP1_Vg. The selected value of resistor PR and the size of MOS capacitor PCT vary depending on various factors such as the size of pre-driver 105, of post driver transistors MP1, MP2, MN1, MN2, output loading at node Vout, etc. Generally, resistor PR and MOS capacitor PCT are selected such that enough voltage is provided to node MP1_Vg to suppress the over-voltage of voltage MP1_Vsd. The over-voltage of voltage MP1_Vsd varies depending on technologies (e.g., process node), the size of transistor MP1, etc. In various embodiments of the invention relevant circuitry is simulated to determine this over-voltage and the appropriate value for resistor PR and MOS capacitor PCT is configured to suppress the unwanted over-voltage. In various embodiments of the invention the maximum voltage of voltage MP1_Vsd is also estimated and/or simulated to select a value for resistor PR, MOS capacitor PCT, voltage Vbias_P, etc. For example, for a 1.8V device, the calculated maximum endurable for voltage MP1_Vsd is about 2.5V, resistor PR, MOS capacitor PCT, and voltage Vbias_P are selected such that voltage MP1_Vg can only produce a maximum voltage MP1_Vsd of 2.5V. In configurations without the disclosed techniques, voltage MP1_Vsd could rise to as high as 3.4V, which can cause undesirable hot-carrier effect.

Voltage Vpgate2 provided by pre-driver 105 through inverter 107-P to the gate of transistor MP2 and MOS capacitor PCT controls transistor MP2 and MOS capacitor PCT. In an embodiment, voltage Vpgate2 is anti-phase (e.g., 180 degree out-of-phase) with voltage Vout. For illustration, voltage Vbias_P is at 1.98V, and voltage Vpgate2 transitions from 3.6V to 1.98V. As a result, the original voltages at two ends (e.g., node Vpgate2 and node MP1_Vg) of MOS capacitor PCT are at 3.6V and 1.98V, respectively. Alternatively expressed, the voltage drop across MOS capacitor PCT is 3.6V−1.98V or 1.62V. When voltage Vpgate2 transitions to 1.98V, one end of MOS capacitor PCT (e.g., node Vpgate2) is 1.98V. Because MOS capacitor PCT tends to retain the 1.62V across it, which, in theory, causes the voltage at the other end (e.g., node MP1_Vg) to be pumped down from 1.98V to 1.98V-1.62V or 0.36V. In an embodiment, however, because resistor PR also fights with the capacitor pumping effect of PMOS capacitor PCT, voltage MP1_Vg is driven to about 1.5V. Because voltage MP1_Vg is at a voltage (e.g., 1.5V) lower than voltage Vbias_P (e.g., 1.98V), voltage MP1_Vg is eventually charged to Vbias_P at 1.98V. At the same time, voltage MP1_Vsg (e.g., the voltage across the source and the gate of transistor MP1) increases higher than the voltage without the disclosed techniques because MP1_Vsg=MP1_Vs−MP1_Vg, and because MP1_Vg decreases, MP1_Vsg, in effect, increases.

Comparable to P-pump circuit 110, N-pump circuit 120, coupled between the gates of transistors MN1 and MN2, provides a pump voltage to node MN1_Vg upon detecting a transition of voltage Vngate2 (e.g., from a low to a high). As a result, transistor MN1 turns on better and causes voltage MN1_Vds to be suppressed to a safe voltage level. In an embodiment, the safe level for voltage MN1_Vds defined by a manufacturing process is 2.5V.

N-pump circuit 120 includes resistor NR coupled between nodes Vbias_N and MN1_Vg, and MOS transistor NCT coupled between nodes Vngate2 and MN1_Vg. MOS transistor NCT serves as a capacitor because its source and drain are coupled together. MOS transistor NCT may be referred to as a MOS capacitor, a capacitor transistor, etc. Resistor NR and MOS capacitor NCT are shown for illustration, but various embodiments of the invention are not so limited. Other circuitry, devices, networks (e.g., a combination of circuitry and/or devices) providing resistance and capacitance in place of resistor NR and transistor NCT are within the scope of various embodiments of the invention. Examples of such circuitry include poly resistors, OD resistors, well resistors, etc., MOM (metal-oxide-metal) capacitors, MIM (metal-insulator-metal) capacitors, MOS varactor capacitors, etc.

Voltage Vbias_N, coupled to one end of resistor NR, provides bias voltage Vbias_N to node MN1_Vg. Under some circumstances, voltage Vbias_N is transferred to node MN1_Vg and works in conjunction with MOS capacitor NCT to suppress unwanted over-voltage of voltage MN1_Vds. For example, voltage Vbias_N provides via resistor NR the bias voltage for transistor MN1 to increase voltage MN1_Vgs and thus reduce/eliminate un-reliabilities from hot-carrier effects. In the over-drive circuit of FIG. 3, voltage Vbias_N is configured to be about 10% below the middle point of 1.8V or 1.62V, which is calculated as the worst case for MN1 reliability concern. In another embodiment of 1.8V device, voltage Vbias_N is configured to be at 1.8V. If voltage Vbias_N is set higher (e.g., 3.6V), voltage MN1_Vgs would be 3.6V, which can cause gate-oxide breakdown.

MOS capacitor NCT, coupled between the gates of transistors MN1 and MN2 (e.g., nodes MN1_Vg and Vngate2), provides a desired voltage to node MN1_Vg as MOS capacitor NCT is configured to retain a voltage difference between gates of transistors MN1 and MN2 previously seen by MOS capacitor NCT. In effect, in various embodiments of the invention MOS capacitor NCT is used to pump a desired voltage to node MN1_Vg. The selected value of resistor NR and the size of MOS capacitor NCT vary depending on various factors such as the size of pre-driver 105, of post driver transistors MP1, MP2, MN1, MN2, output loading at node Vout, etc. Generally, resistor NR and MOS capacitor NCT are configured such that enough voltage is provided to node MN1_Vg to suppress the over-voltage of voltage MN1_Vds. The over-voltage of voltage MN1_Vds varies depending on technologies (e.g., process node), the size of transistor MN1, etc. In various embodiments of the invention the relevant circuitry can be simulated to determine this over-voltage and the appropriate value for resistor NR and MOS capacitor NCT to suppress the unwanted over-voltage. In various embodiments of the invention the maximum voltage of voltage MN1_Vds is also estimate and/or simulated to select a value for resistor NR, MOS capacitor NCT, voltage Vbias_N, etc. For example, for a 1.8V device, the calculated maximum endurable for voltage MN1_Vds is about 2.5V, resistor NR, MOS capacitor NCT, and voltage Vbais_N are selected such that voltage MN1_Vg can only produce a maximum voltage MN1_Vds of 2.5V. Without techniques of various embodiments of the invention, voltage MN1_Vds could rise to as high as 3.4V, which can cause undesirable hot-carrier effect.

Voltage Vngate2 provided by pre-driver 105 through inverter 107-N to the gate of transistor MN2 and MOS capacitor NCT controls transistor MN2 and MOS capacitor NCT. In an embodiment, voltage Vngate2 is the same phase with voltage Vout. For illustration, voltage Vbias_N is at 1.62V, and voltage Vngate2 transitions from 0V to 1.62V. As a result, the original voltages at two ends (e.g., node Vngate2 and node MN1_Vg) of MOS capacitor NCT are at 0V and 1.62V, respectively. Alternatively expressed, the voltage drop across MOS capacitor NCT is 1.62V-0V or 1.62V. When voltage Vngate2 transitions to 1.62V one end of MOS capacitor NCT (e.g., node Vngate2) is 1.62V. Because MOS capacitor NCT tends to retain the 1.62V across it, which, in theory, causes the voltage at its other end (e.g., node MN1_Vg) to be pumped up from 1.62V to 1.62V+1.62V or 3.24V. In an embodiment, however, because resistor NR also fights with the capacitor pumping effect of NMOS capacitor NCT, voltage MN1_Vg increases to about 2.25V. Because voltage MN1_Vg is at a voltage (e.g., 2.25V) higher than voltage Vbias_N (e.g., 1.62V), voltage MN1_Vg is eventually discharged to Vbias_N at 1.62V. At the same time, voltage MN1_Vgs (e.g., the voltage across the gate and the source of transistor MN1) increases higher than the voltage without the disclosed techniques because MN1_Vgs=MN1_Vg−MN1_Vs, and because MN1_Vg increases, MN1_Vgs, in effect, increases.

Illustrative Waveforms

Figure 4:
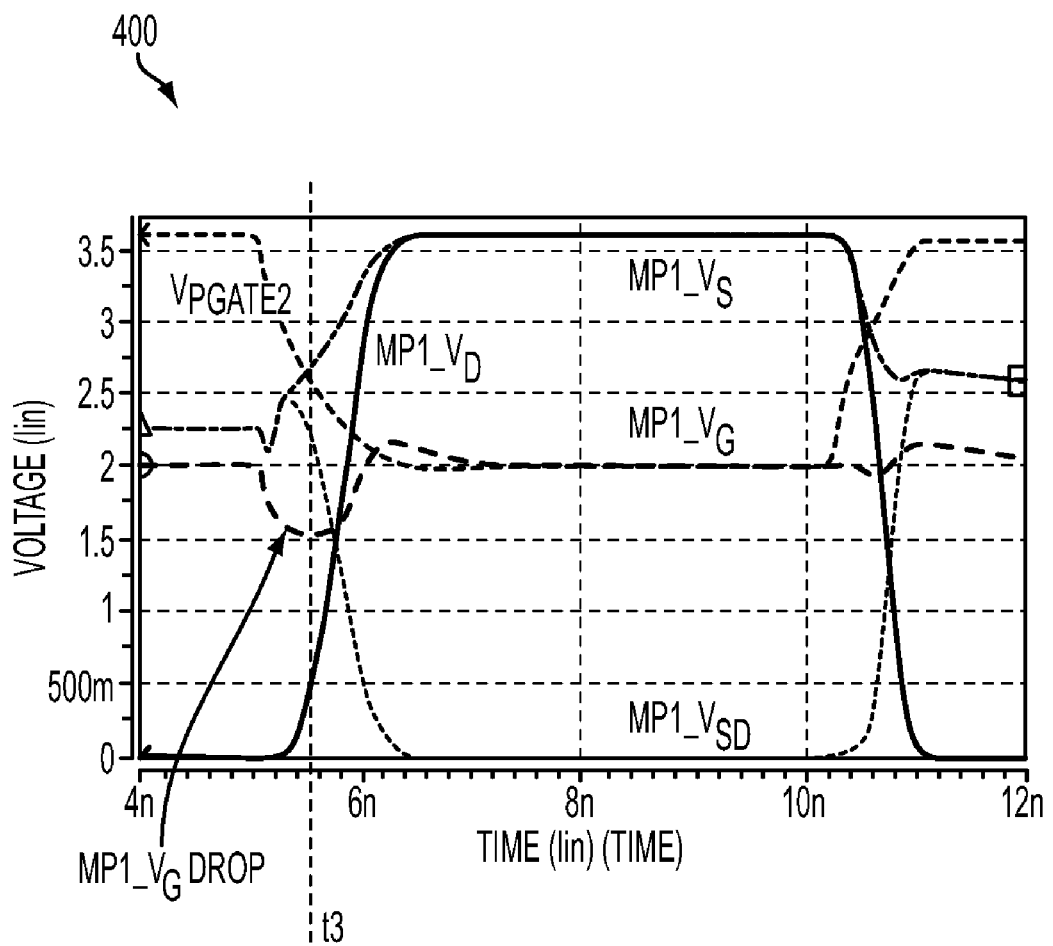
FIG. 4 shows waveforms illustrating operation of the circuit in FIG. 3 with respect to the PMOS transistors, in accordance with an embodiment.

FIG. 4 shows waveforms 400 illustrating operation of circuit 300 with respect to P-pump circuit 110. In this illustration, various embodiments are advantageous when node Vout or the drain of transistor MP1 (e.g., node MP1_Vd) is transitioning from a low to a high and voltage Vpgate2 is transitioning from a high toward voltage Vbias_p. For illustration, such transitions occur at time t3 (e.g., about 5 ns in FIG. 4). Further, a low voltage level is about 0V while a high voltage level is about 3.6V, and voltage Vbias_P is configured at 1.98V.

At time t3, voltage MP1_Vd (or voltage Vout) transitions from 0V to 3.6V, voltage MP1_Vsd is about to switch from about 2.25V to 0V, and voltage Vpgate2 is about to switch from 3.6V toward 1.98V (e.g., toward voltage Vbias_P). At the same time, voltage MP1_Vs (e.g., the voltage at the source of transistor MP1) is about to switch from about 2.25V to 3.6V. Because voltage MP1_Vs is about to switch to 3.6V quicker than voltage MP1_Vd, it tends to cause higher MP1_Vsd during voltage Vout is transitioning from a low to a high. In accordance with some embodiments, however, voltage Vbias_P, together with resistor PR and transistor PCT, causes a coupling of voltage Vbias_P to node MP1_Vg, which also causes a drop in voltage MP1_Vg shown as voltage MP1_Vg_drop that prevents or reduces an over-voltage of voltage MP1_Vsd. Alternatively stated, the peak of voltage MP1_Vsd is suppressed to be within a safe voltage of about 2.5V. Without various embodiments of the invention, this peak of MP1_Vsd could be as high as 3.4V.

Figure 5:
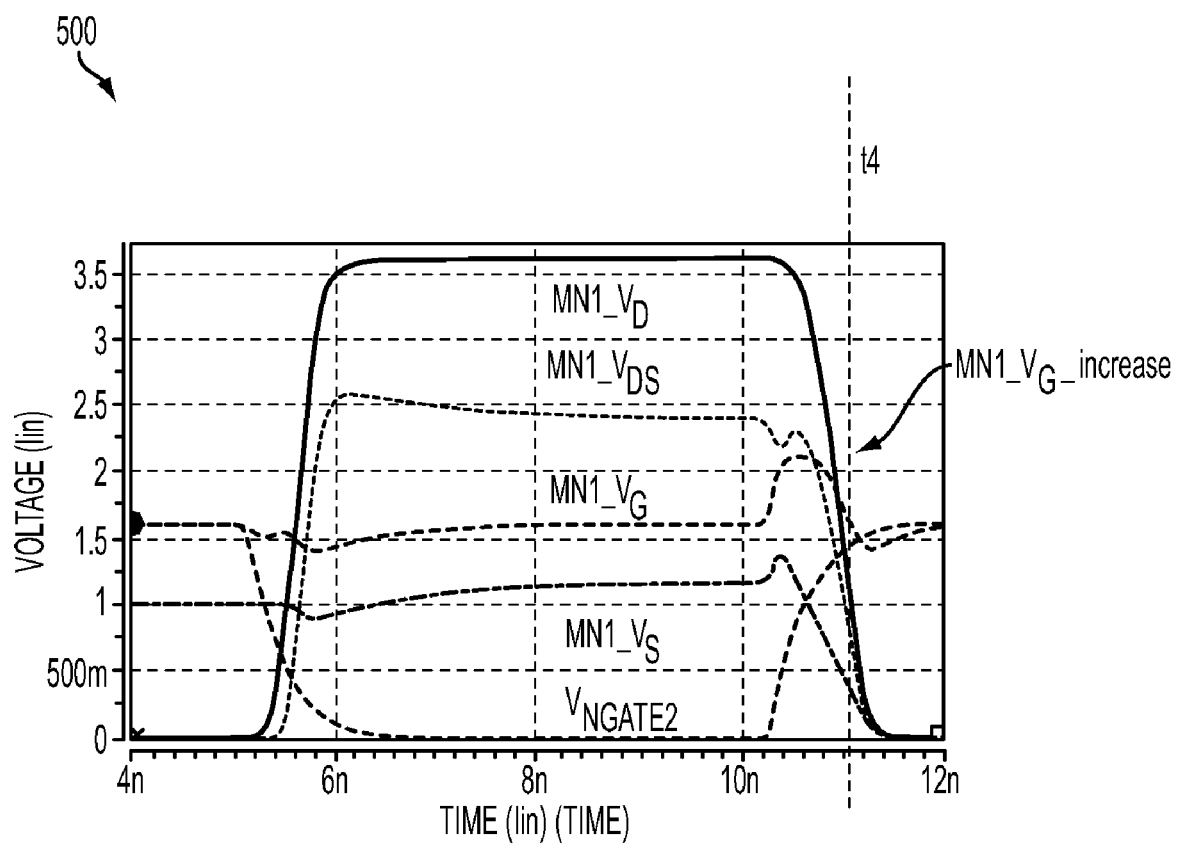
FIG. 5 shows waveforms illustrating operation of the circuit in FIG. 3 with respect to the NMOS transistors, in accordance with an embodiment.

FIG. 5 shows waveforms 500 illustrating operation of circuit 300 with respect to N-pump circuit 120. In this illustration, some embodiments are advantageous when node Vout or the drain of transistor MN1 (e.g., node MN1_Vd) is transitioning from a high to a low and voltage Vngate2 is transitioning from 0V toward voltage Vbias_N. For illustration, such transitions occur at time t4 (e.g., about 11 ns in FIG. 5). Further, a low logic level is about 0V while a high voltage level is about 3.6V, and voltage Vbias_N is configured at 1.62V.

At time t4, voltage MN1_Vd (or voltage Vout) transitions from 3.6V to 0V, voltage MN1_Vds is about to switch from about 2.5V to 0V, and voltage Vngate2 is about to switch from 0V to 1.62V (e.g., to voltage Vbias_N). At the same time, voltage MN1_Vs (e.g., voltage at the source of transistor MN1) is about to switch from about 1.2V to 0V. Because voltage MN1_Vs is about to switch to 0V quicker than voltage MN1_Vd, it tends to cause higher MN1_Vds during voltage Vout is transitioning from a high to a low. In accordance with some embodiments, however, voltage Vbias_N, together with resistor NR and transistor NCT, causes a coupling of voltage Vbias_N to node MN1_Vg, which also causes an increase in voltage MN1_Vg shown as voltage MN1_Vg_increase that prevents or reduces an over-voltage of voltage MN1_Vds. Alternatively stated, the peak of voltage MN1_Vds is suppressed to be within a safe voltage of about 2.5V. Without various embodiments of the invention, this peak could be as high as 3.4V.

Circuit Embodiment to Eliminate the Back-Gate Bias Effect

In an embodiment, to eliminate the back-gate bias effect, the body and source of transistor MP1 are tied together so that voltage MP1_Vsb, the voltage between the source to the body, is zero, which, in turn, causes the threshold voltage MP1_Vth of transistor MP1 to decrease and thus turns on transistor MP1 better. As a result, voltage MP1_Vsd peak is further reduced to about 2.3V, as compared to about 2.5V, in the above example in FIG. 4. Similarly, the body and the source of transistor MN1 are tied together so that voltage MN1_Vsb, the voltage between the source to the body, is zero, which, in turn, causes the threshold voltage MN1_Vth of transistor MN1 to increase and turns on transistor MN1 better. As a result, voltage MN1_Vds peak is further reduced to about 2.3V, as compared to about 2.5V, in the above example in FIG. 5.

Figure 6:
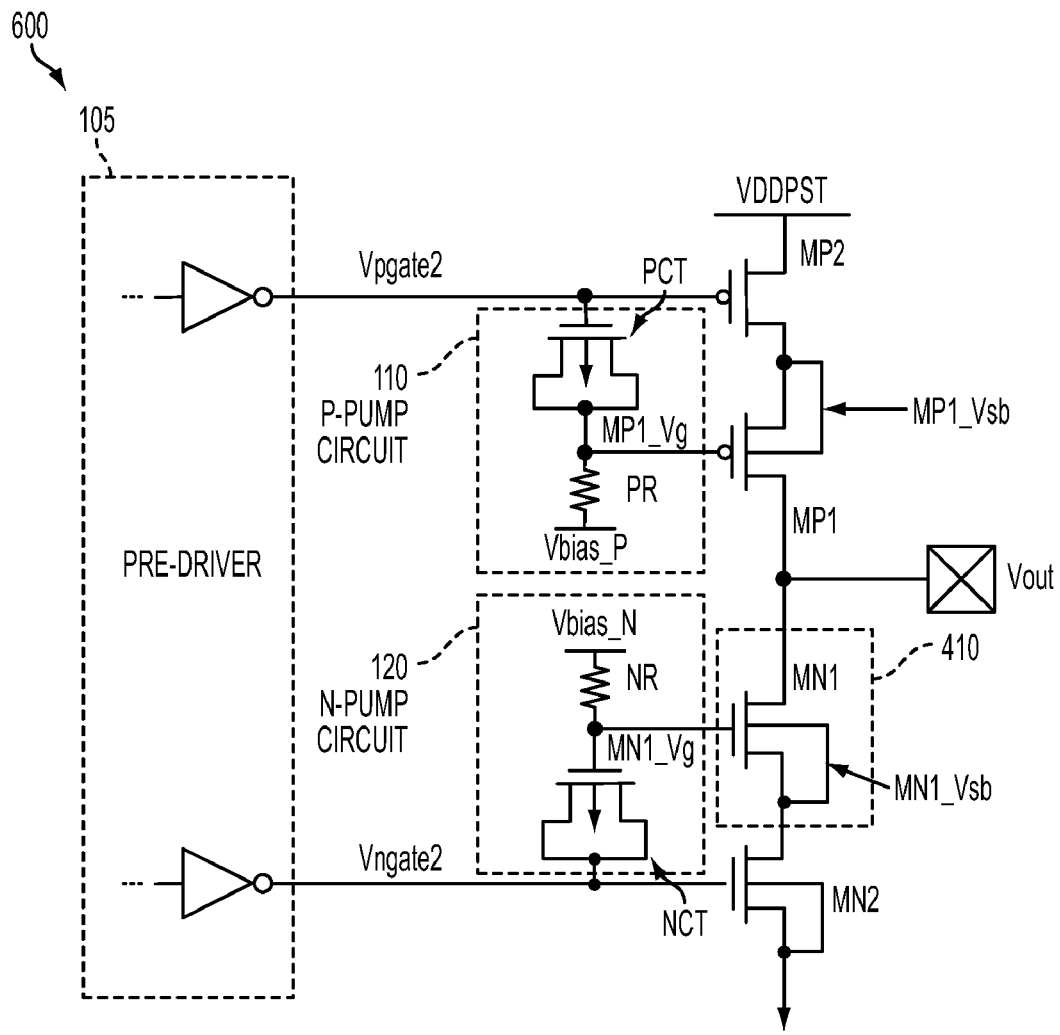
FIG. 6 shows a schematic drawing of an exemplary circuit in accordance with another embodiment.

FIG. 6 shows a circuit 600 illustrating the source and the body of transistors MP1 are coupled together and the source and body of transistors MN1 are coupled together. In an embodiment, when the source and the body of transistor MN1 are coupled together, and a deep N-well (e.g., deep N-well 410) is used to isolate the body of transistor MN1 from the common P-substrate.

A number of embodiments of the invention have been described. It will nevertheless be understood that various modifications may be made without departing from the spirit and scope of the invention. For example, various embodiments of the invention are not limited to a particular level when a signal is activated or deactivated, but, rather, selecting such a level is a matter of design choice and is within the scope of the invention. The various transistors being shown as a particular type (e.g., NMOS, PMOS, etc.) are also for illustration, various embodiments of the invention are not limited to a particular type, but the particular type selected for a transistor is also a design choice and is within the scope various embodiments of the invention.

What is claimed is:

1. A circuit comprising:
   a first signal path;
   a first transistor having a first gate coupled to the first signal path;
   a second signal path;
   a second transistor coupled to the first transistor in a stacked configuration, and having a second gate coupled to the second signal path; and
   a pump circuit coupled to the first signal path and to a bias path having a bias voltage;
   wherein the pump circuit comprises a capacitive device and is configured to generate a first voltage at the first gate of the first transistor based on the bias voltage upon detecting a transition from a first voltage level toward a second voltage level of an input voltage received by the pump circuit at a terminal of the capacitive device.

2. The circuit of claim 1 wherein the pump circuit is configured to receive the input voltage at the second gate of the second transistor.

3. The circuit of claim 1 wherein the capacitive device includes one or a combination of a capacitor, a capacitor transistor, a metal-oxide-metal capacitor, a metal-insulator-metal capacitor, or a MOS varactor capacitor.

4. The circuit of claim 1 wherein the pump circuit is configured to generate the first voltage based on the capacitive device of the pump circuit being coupled to the first gate and configured to retain a voltage seen across the capacitive device.

5. The circuit of claim 4 wherein the voltage seen across the capacitive device is based on the input voltage and the bias voltage.

6. The circuit of claim 1 wherein the pump circuit further includes a resistive device, the capacitive device and the resistive device configured based on a behavior of a voltage between a drain and a source of the first transistor.

7. The circuit of claim 6 wherein the source and a body of the first transistor are coupled together thereby causing a change in a threshold voltage of the first transistor and to suppress an over-voltage across the drain and the source of the first transistor.

8. The circuit of claim 1 wherein when the first and the second transistors are NMOS, the circuit further comprising an N-well isolating a body of the first transistor from a common P-substrate.

9. A circuit comprising:
   a first PMOS transistor and a second PMOS transistor coupled together in a stacked configuration;
   a first pump circuit coupled to a gate of the first PMOS transistor and configured to provide a first voltage at the gate of the first PMOS transistor; the first voltage configured to suppress a first over-voltage between a source and a drain of the first PMOS transistor when an output of the circuit is transitioning from a first logic state to a second logic state;
a first NMOS transistor and a second NMOS transistor coupled together in another stacked configuration; and
a second pump circuit coupled to a gate of the first NMOS transistor and configured to provide a second voltage at the gate of the first NMOS transistor; the second voltage configured to suppress a second over-voltage between a source and a drain of the first NMOS transistor when the output of the circuit is transitioning from the second logic state to the first logic state, wherein
the first pump circuit comprises
   a first capacitive device; a first terminal of the first capacitive device coupled to a gate of the second PMOS transistor; a second terminal of the first capacitive device coupled to the gate of the first PMOS transistor, and
the second pump circuit comprises
   a second capacitive device; a first terminal of the second capacitive device coupled to a gate of the second NMOS transistor; a second terminal of the second capacitive device coupled to the gate of the first NMOS transistor.

10. The circuit of claim 9 wherein
the first pump circuit further comprises
   a first resistive device; a first terminal of the first resistive device coupled to the gate of the first PMOS transistor; a second terminal of the first resistive device coupled to a first bias voltage node; and
the second pump circuit further comprises
   a second resistive device; a first terminal of the second resistive device coupled to the gate of the first NMOS transistor; a second terminal of the second resistive device coupled to a second bias voltage node.

11. The circuit of claim 10 wherein one or a combination of the first capacitive device and the second capacitive device comprises one or a combination of a capacitor, a capacitor transistor, a metal-oxide-metal capacitor, a metal-insulator-metal capacitor, a MOS varactor capacitor.

12. The circuit of claim 10 wherein
the first capacitive device and the first resistive device are configured based on the first over-voltage; and
the second capacitive device and the second resistive device are configured based on the second over-voltage.

13. The circuit of claim 10 wherein one or a combination of the first resistive device and the second resistive device comprises one or a combination of a resistor, a poly resistor, a resistor in a diffusion region, or a well resistor.

14. The circuit of claim 9 wherein
the first pump circuit is configured to generate the first voltage to the gate of the first PMOS transistor based on a voltage received from a gate of the second PMOS transistor and a first bias voltage on a first bias voltage node ; and
the second pump circuit is configured to generate the second voltage to the gate of the first NMOS transistor based on a voltage received from a gate of the second NMOS transistor and a second bias voltage on a second bias voltage node.

15. The circuit of claim 9 wherein
when the first voltage is configured to suppress the first over- voltage, the circuit is configured to receive a voltage at the gate of the second PMOS transistor that is out of phase with a voltage at the output of the circuit.

16. The circuit of claim 9 wherein
the source and a body of the first PMOS transistor are coupled together;
and
   the source and a body of the first NMOS transistor are coupled together.

17. The circuit of claim 16 further comprising an N-well isolating the body of the first NMOS transistor from a common P-substrate.

18. A circuit comprising:
a first transistor having one of a source and a drain serve as an output of the circuit;
a second transistor of a same dopant type as that of the first transistor; one of a source and a drain of the second transistor coupled to a voltage source and the other of the source and the drain of the second transistor is coupled to the other of the source and the drain of the first transistor;
a capacitive device coupling a first gate of the first transistor and a second gate of the second transistor; and
a resistive device coupling the first gate of the first transistor and a bias voltage node configured to provide a bias voltage between a first logic level and a second logic level of the output of the circuit.

19. The circuit of claim 18 wherein a body and the source of the first transistor are coupled together to suppress an over-voltage.

20. The circuit of claim 19 further comprising an N-well isolating the body of the first transistor from a common P-substrate.

* * * * *